United States Patent [19]

Becker et al.

[11] 4,121,147
[45] Oct. 17, 1978

[54] ELECTRIC METER FOR MOUNTING WITH A STANDARD WATTHOUR METER

[75] Inventors: Dale F. Becker, Seneca, S.C.; Trevor N. Samuel, Rochester, Ill.

[73] Assignee: Sangamo Electric Company, Springfield, Ill.

[21] Appl. No.: 722,594

[22] Filed: Sep. 13, 1976

Related U.S. Application Data

[63] Continuation of Ser. No. 538,164, Jan. 2, 1975, abandoned.

[51] Int. Cl.$^2$ .................... G01R 19/16; G01R 1/04
[52] U.S. Cl. ................................. 324/104; 324/156; 324/157; 361/369
[58] Field of Search ........... 324/104, 156, 157, 103 R; 317/104, 106; 361/369, 370, 371

[56] References Cited

U.S. PATENT DOCUMENTS

| | | | |
|---|---|---|---|
| 1,905,262 | 4/1933 | Bradshaw | 324/157 |
| 3,714,516 | 1/1973 | Howe | 324/156 |

*Primary Examiner*—Rudolph V. Rolinec
*Assistant Examiner*—Ernest F. Karlsen

*Attorney, Agent, or Firm*—Emrich, Root, O'Keeffe & Lee

[57] ABSTRACT

An electrical meter for use with a standard watthour meter and a standard meter socket having a housing which includes a display area, a meter receiving section having a base plate which supports a plurality of jaw members positioned to receive the blades of a standard watthour meter, meter socket engaging blades extending rearwardly of the housing and positioned to engage the jaws of a standard meter socket, an electrical meter assembly supported within a longitudinally disposed part of the housing and in tandem relation with the watthour meter and the meter socket including an indicator located adjacent the display area, a plurality of conductors connecting the blades to the jaw members, the electrical meter assembly being coupled to at least one of said conductor means to provide a power measurement on the indicator, the housing and the electrical meter assembly in said housing being located within a circumference defined by the rearward projection of the circumference of the base of the standard watthour meter.

12 Claims, 13 Drawing Figures

ELECTRIC METER FOR MOUNTING WITH A STANDARD WATTHOUR METER

This is a continuation, of application Ser. No. 538,164, filed Jan. 2, 1975, now abandoned.

FIELD OF THE INVENTION

The present invention relates to demand meters for use with existing watthour meter installations.

BACKGROUND OF THE INVENTION

The electric public utility companies have for many years supplied the electric power demands of the consumer in an efficient and reliable manner. In order to maintain this high standard of service, the utilities have continually monitored the changing needs of their consumers, and have with reasonable accuracy, projected in advance the expected power requirements of the area served by their system, and have added to the generating capability of the system as necessary to meet such demand.

In recent years, however, the population explosion, the unexpected development of new subdivisions and new industrial complexes in areas served by the system, and the development of new and varied types of power consuming devices, both in the home and in industry, have made the accurate projection of future consumption more difficult. In addition, the cost of adding the further generating and transmission capabilities to the system and the increased fuel and labor costs incurred in operating such systems, has risen significantly while the billing rate to the consumer has, by reason of commission regulations, increased somewhat more slowly. As a result of these and other problems, the utilities are seeking a method of obtaining the revenue necessary to provide the generating equipment required to supply the needs of the consumer while yet apportioning the cost of such equipment and the generated power on a fair and equitable basis.

As one possible solution to the problem a number of the utilities are considering the possibility of using demand metering in residential areas served by their system. Such method of metering is well known and has been used extensively in industrial areas. In systems using demand metering, the customer charge is based upon both the total amount of energy used in a given period, and the maximum amount of power called for during the billing period. Such method of billing is considered more equitable than the conventional billing which is based on watthour measurement along. That is, in any system the utility must provide equipment which will satisfy the maximum demand of the system even though such demand may occur during only limited periods of the day. The utility is thus forced to purchase and install equipment which has a generating and distribution capability significantly greater than that which is required for a major part of the day. There is an interest therefore in reducing the maximum demand load of the system.

Demand meters provide the company with the capability of billing each consumer in accordance with the amount such consumer contributes to the maximum demand on the system. Since lowering of the demand by a consumer will result in a smaller bill, the consumer is encouraged to reduce his power requirements by deferring certain loads. The reduction of the power used by each consumer in turn reduces the total demand, and results in a more efficient operating system.

While the use of demand metering is considered by a number of companies to be both desirable and equitable, the cost of changeover of a system to such form of metering is a serious deterrent to its proposed use. That is, the replacement of each residential watthour meter in a system with the more expensive combination demand and watthour meters available on the market would be most expensive. In addition to the high initial purchase cost of the combination meters, there is the further loss due to an inventory buildup of a large number of unused watthour meters.

In an effort to provide a more practical solution to the problem, certain of the meter manufacturers have offered conversion kits for use in refitting the existing watthour meters so as to operate as a mechanical combination meter. As a practical matter, such refit is preferably effected in the shop so that the meter may be tested for accuracy after such refit. In the use of such type kits, the installer must pick up the unit in the field and return the same to the shop for the purpose of rebuilding. After the meter has been rebuilt, the necessary tests must be made, and the modified meter is returned to the field as a replacement for a further watthour meter in the system.

In addition to the time and expense involved in travelling to and from the field location, there is the further time and expense required by reason of the replacement of an existing meter with a modified mechanical combination meter. That is, the watthour meter at the time of removal will have a reading which represents the energy consumed at the time of replacement, and the modified combination meter, having been used previously at a different location, will have a totally unrelated reading. It is therefore necessary at the time of replacement to make a record of the readings on both meters and to report such readings to the billing department. At the end of the billing period the billing department must then calculate the measurements made by both meters during the period so that the bill for the energy consumed during such period is accurate.

Other companies have proposed refit kits which are intended to be installed in the field. However, in some states, the public utility commissions require that any meter upon which the seal is broken be returned to the shop for test purposes. Further, refit in the field is difficult, time consuming and costly.

In addition to being time consuming and expensive, such kits are for the most part limited for use with the particular type of meter which is manufactured by the company which provided the kit. Since most public utilities use the meters of several different manufacturers, the problem still remains as to how the meters of the other manufacturers and the different vintages of any one manufacturer may be modified so that the entire system will be on a demand metering basis.

In yet another approach to the problem certain manufacturers have provided special meters which as purchased have special attachments to facilitate changeover of a watthour meter to a demand meter. One such meter is shown in U.S. Pat. No. 2,482,793. While such arrangement does facilitate the addition of a thermal demand metering to a watthour meter, the problems noted above with respect to refit kits (i.e., the need to open the meter in the field or shop, the loss of reading during conversion, the related reporting problems when meters are interexchanged, and the problem of testing when required) are also present in such arrangement. In addition, such arrangement will provide an answer for only those utilities which purchase such type of meter from the particular meter company which manufactures the same to replace the watthour meters which are presently installed.

SUMMARY OF THE INVENTION

The present invention is directed to a novel auxiliary electrical meter, such as a demand meter which may be used with the watthour meter which is presently located at the residence of the consumer without requiring any modification of the existing watthour meter, and without requiring any changes in the watthour meter records.

The invention is specifically directed to a demand meter (shown as a thermal demand meter herein) which includes a housing having a meter engaging section which includes a recessed base member at one end for supporting a pair of line jaws and a pair of load jaws in a position to engage the load blades and line blades of a standard watthour meter as assembled therewith. The outer peripheral rim of the housing is of similar dimension to the outer peripheral rim of a watthour meter socket to permit the use of a sealing ring with such rims when the watthour meter is attached to the meter receiving section of the thermal demand meter.

The housing member includes a meter socket engaging section including a second base member for closing the other end of the housing and a pair of line blades and a pair of load blades which project rearwardly of the second base member. The line blades and load blades are positioned to engage the line and load jaws respectively on a standard meter socket. A first pair of conductor means extend through the housing between the two base members to connect the line jaws to the line blades, and a second pair of conductor means extend through the housing to connect the load jaws to the load blades.

A thermal demand meter assembly supported within the housing between said first and second base members is coupled to at least two of the conductors for the purpose of measuring the demand power used by the consumer. A scale and associated pointer in such assembly are located adjacent a viewing area on the housing to provide a visual readout of the thermal demand measurements, whereby both demand power measurements are provided by the thermal demand meter and the watthour measurements which are provided by the watthour meter.

A further feature of the meter is the manner in which the time required for the changeover is reduced to that involved in breaking the existing meter seal, removing the existing watthour meter from the meter socket, inserting the watthour meter previously used into the meter receiver socket on the thermal demand meter, inserting the novel thermal demand meter and watthour meter in the meter socket, and sealing the assembled units.

Other objects and features will be apparent from the following description taken in conjunction with the accompanying drawings, in which.

STANDARD WATTHOUR METER INSTALLATION

Figure 1:
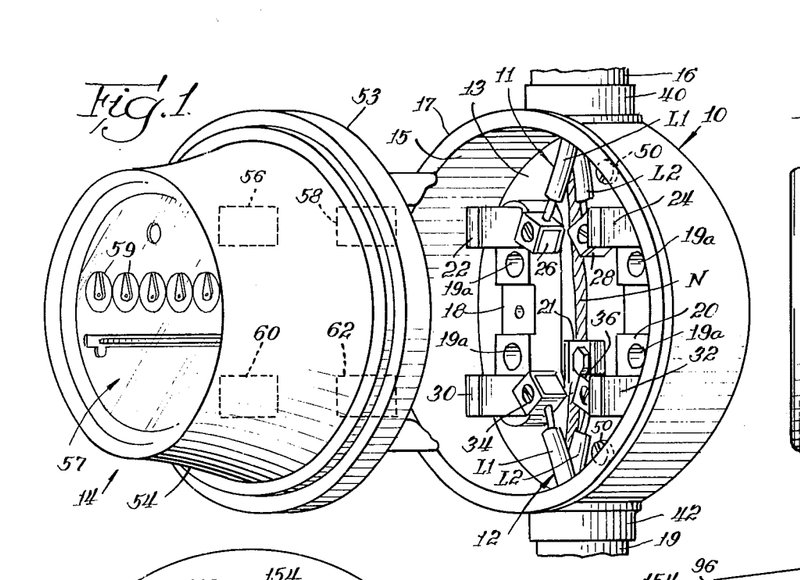
FIG. 1 is an exploded perspective side view of a conventional watthour meter installation including a watthour meter and conventional type meter socket.
Figures 2, 3:
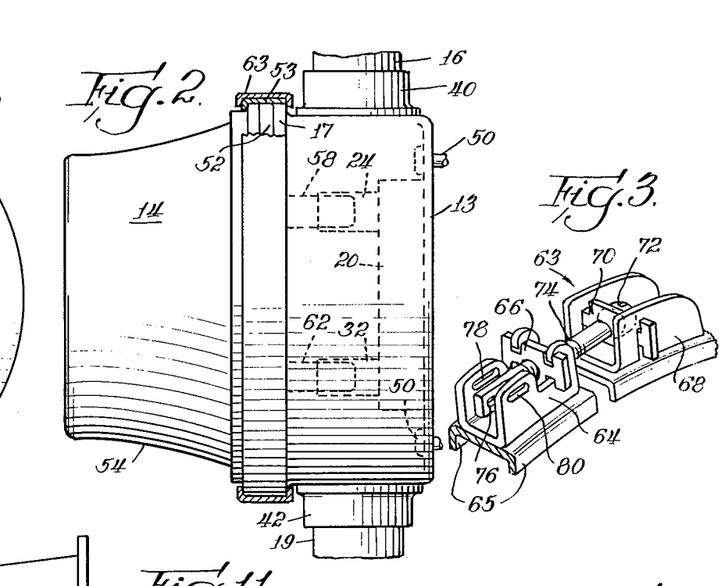
FIG. 2 is a side view of the meter and socket as assembled.
FIG. 3 is a partial perspective view of one type of sealing ring which is used to seal the meter and socket as assembled.

With reference to FIGS. 1-2, there is shown thereat a conventional watthour meter installation including a standard meter socket 10 and a standard watthour meter 14 for providing a measurement of the power provided over the line conductors 11 to the load conductors 12. The watthour meter 14 set forth in FIGS. 1-2 is of the type commercially available from Sangamo Electric as a J4 meter, but, as will be shown, may comprise a watthour meter available from any of the other U.S. meter manufacturers which has a watthour meter base which is adapted for use with a meter socket which meets the industry standards as set forth by AEIC-EEI-NEMA Standard EEI Publication MSJ-7.

The conventional meter socket 10, comprises an annular shaped recessed socket having an integrally formed circular bottom wall 13 and a cylindrical side wall 15. A rim or flange 17 located on the outer end of said wall 15 has an outer face which forms a seat for the base of meter 14 as assembled with meter socket 10.

Meter socket 10 includes a pair of spaced insulating blocks 18, 20 secured to the bottom wall of the meter socket base 13 by suitable fastener members 19a. A first pair of spring jaws 22, 24 (line jaws) are secured respectively to the upper ends of insulating blocks 18, 20, with the blade receiving throat disposed in a vertical plane when the meter socket is installed. Connector members 26, 28 are secured in electrical contact with jaws 22, 24 respectively. A second pair of jaws 30, 32 (load jaws) are secured to the lower ends of the insulating blocks 18, 20 respectively. Connector members 34, 36 are secured in electrical contact with jaws 30, 32 respectively.

A first coupling member 40 having an interiorly threaded portion for receiving conduit member 16 is located on the side wall 15 of the meter socket 10 for the L1, L2 N line conductors 11 which are fed through conduit 16. A second coupling member 42 located on the outer wall of the meter socket 10 approximately 180° from the first coupling member 40 is internally threaded to receive conduit member 19 and to provide a passageway from the interior of meter socket 10 for the L1, L2 N load conductors 12. Ground terminal 21 is secured to the bottom wall 13 inside the meter socket.

In use, the meter socket 10 is attached to a suitable supporting base, such as the wall of a building by suitable fastening means, such as screws 50, and the conduits 16 and 19 are threaded into the coupling members 40, 42. The entrance or line cable 11 is then fed through conduits 16 and the line conductors L1, L2 and fastened to connectors 26, 28 respectively. The ground conductor N is fastened to ground connector 21. In a similar manner, conduit 19 is turned into coupling member 42, and load conductors 12 are fed therethrough to the interior of meter socket 10. Load conductors L1 and L2 are fastened to connectors 34, 36 respectively, and ground conductor N is fastened to ground terminal 21.

The watthour meter 14, as shown in FIGS. 1 and 2, comprises a base member 52 which supports the watthour meter elements (not shown). Cover ring 53 holds a protective housing 54, (the shape of which varies with the meter manufacturer), in engagement with the meter base member 52 to provide a sealed housing for the elements of the watthour meter. Housing 54 includes a viewing area 57 through which dials 59 provide a readout of the watthour measurements which are made by the watthour meter elements of the energy which is used by the consumer connected to the load conductors.

Four terminal blades 56, 58, 60, 62 project outwardly and rearwardly of the meter base 52, and are located to engage the four jaws 22, 24, 30, 32 on the meter socket 10 when the watthour meter 14 is assembled with the meter socket 10.

In the installation of a meter in the field, the watthour meter 14 is moved toward the meter socket 10, and the blades 56, 58 and 60, 62 are brought into contact and urged firmly into the jaws 22, 24 and 30, 32 on the meter socket 10, to cause the jaws to make firm engagement with the blades. The jaws by spring action retain the blades and meter in such position. When thus assembled, the outer bottom face of base 52 is in contact with the outer face of the rim 17 of the meter socket. A sealing ring 63 (FIG. 3) which comprises a split annular ring of a flexible material having downwardly depending sides 65 is opened sufficiently to permit introduction of the ring over the watthour meter 14 to a position adjacent the rim 17 and cover ring 53 of the meter socket 10 and the watthour meter 14 respectively. Sealing ring 63 includes a first U-shaped member 64 attached to one end of the split annular ring 63 having a bridge member 66 extending between the upwardly extending sides of the U-shaped member 64. A second cooperating projecting member 68 attached to the other end of the annular ring 63 includes a pair of upwardly extending sides which support a bridge member 70 therebetween. A clamping screw 72 extends through a cooperating aperture on bridge member 70, and a threaded shank portion 74 of clamping screw 72 is turned into a threaded aperture on bridge 66. As the clamping screw is turned, the split ring 63 is drawn together and the downwardly depending sides are brought into engagement with the outer sides of rim 17 and cover ring 53 on the meter socket 10 and meter 14 respectively to maintain the meter 14 in tightly clamped and sealed relation with the meter socket 10. The end portion of clamping screw 72 which extends beyond the threaded portion carries a slot 76 which is brought into alignment with a pair of mating slots 78 and 80 located on the sides of the projecting member 64 when the clamping screw has been tightened, whereby a seal may be inserted through the respective slots 76, 78 and 80 to complete the watthour meter installation.

THERMAL DEMAND METER

Figure 4:
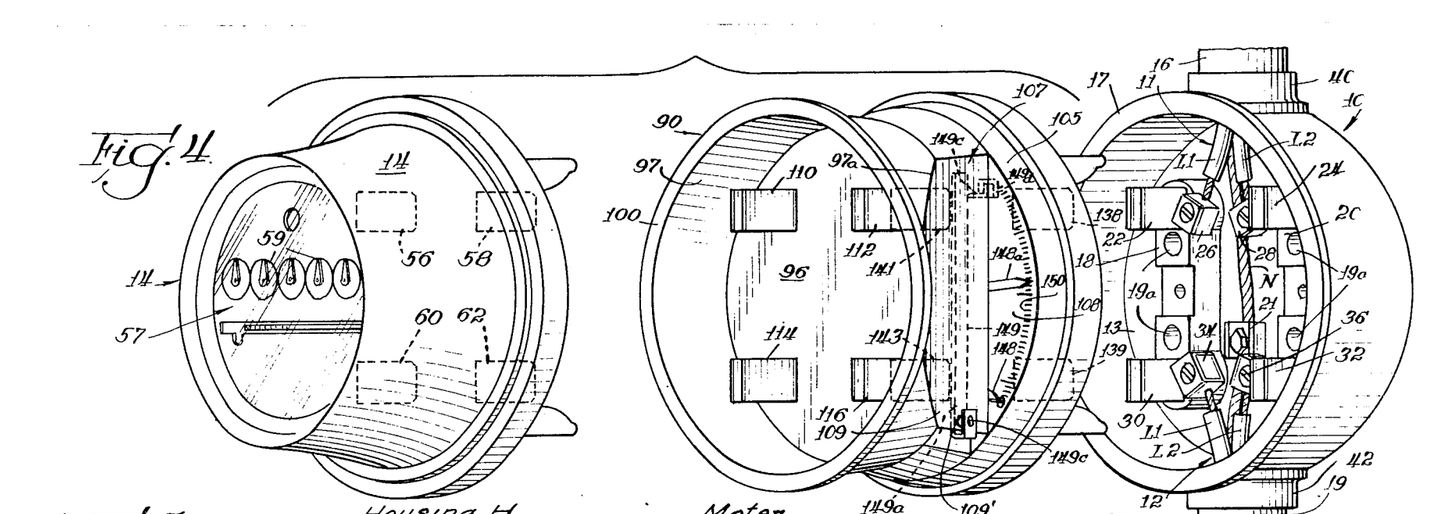
FIG. 4 is an exploded perspective side view of the preferred embodiment of the novel thermal demand meter as used with the watthour meter and meter socket of FIG. 1.
Figure 5:
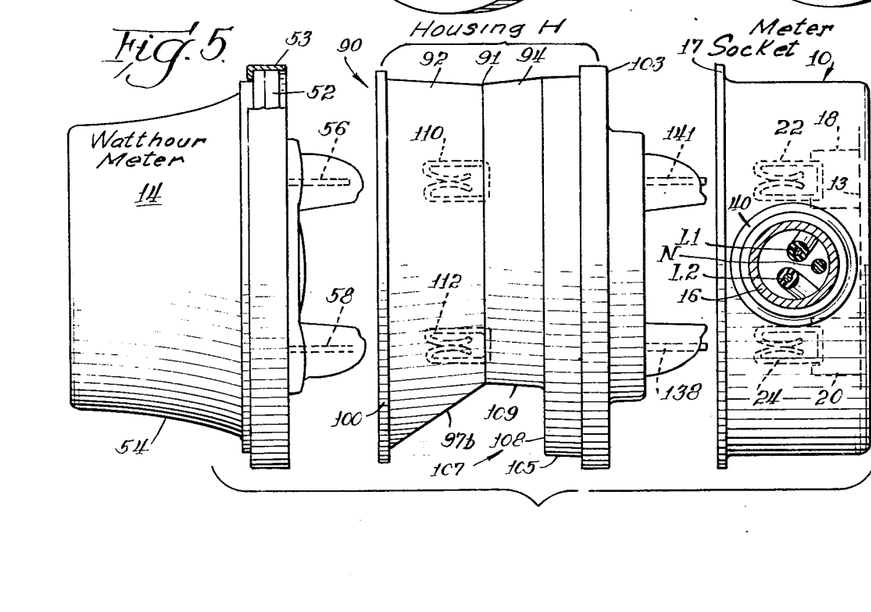
FIG. 5 is a top view of the meter shown in FIG. 4.
Figure 6:
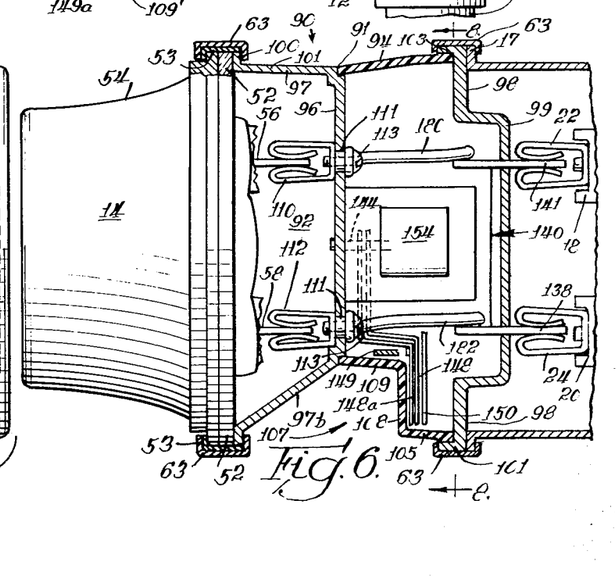
FIG. 6 is a top view of the meter shown in FIGS. 4 and 5 as assembled.

In a first embodiment shown in FIGS. 4–9, the novel thermal demand meter 90 comprises a housing H which, as best shown in FIG. 6, includes a meter receiving section 92, a housing section 94 for the thermal demand meter elements including a display area 107 (FIG. 4). The meter receiving section 92 comprises a substantially circular base member 96 (FIG. 4) having a sleeve-like portion 97 which includes a cylindrical portion 97a extending forwardly from the base plate 96 and terminates in a locating rim 100 at the outer end thereof. Rim 100 is dimensioned to conform to, and mate with, the outer rim of base 52 of a standard watthour meter 14, whereby a standard sealing ring (FIG. 3) may be used with such flange to urge the watthour meter 14 into firm abutting relation with meter receiving section 92 when assembled therewith. A further portion of the sleeve-like portion 97 tapers inwardly as at 97b from rim 100 to provide a cutaway section which facilitates viewing and readout of the display area 107 which is located on the housing section 94.

A first pair of line jaws 110, 112 are secured to base 96 by screw means 113 (FIG. 6), each of which projects through the base member 96 into engagement with a threaded aperture on the associated jaw. Line jaws 110, 112 are positioned to mate with the line terminal blades 56, 58 of a conventional watthour meter. A second pair of jaws 114, 116 are secured to base member 96 by screw means 115 (FIG. 8) and are respectively positioned (FIG. 4) to cooperate with and receive the load terminal blades 60, 62 of a standard watthour meter 14.

Housing section 94 (FIGS. 4, 5, 6) of the thermal demand meter housing 90 locates the thermal demand meter assembly, and such assembly may comprise any one of a number of thermal demand meter assemblies manufactured and commercially available in the marketplace. The elements of a typical assembly and the mounting thereof are set forth in detail hereinafter.

The housing section 94 comprises a generally circular base member 98 having a centrally recessed portion 99 and a wall 101 which extends forwardly thereof and is dimensioned at its forward end to conform with an annular ledge 102 located on the bottom wall of the meter receiving section 92. Wall 101 is generally cylindrical except for a section which includes display area 107. Display area 107 includes a rearward section 105 which conforms to the periphery of the base member 98 and extends forwardly therefrom to provide a housing for indicator means which includes a first or pusher pointer 148, a second or maximum demand indicator pointer 148a, and a scale 150. A wall section 108 extends radially inwardly from the peripheral housing portion 105 to a ledge 109 which extends substantially perpendicular thereto forwardly to mate with the terminating ends of the inwardly sloping portion 97b of wall 97. An aperture is provided in housing 94 immediately beside ledge 109 to provide access via reset slider member 149 to the maximum demand pointer 148a. Reset slider member 149 comprises a first U-shaped portion 149a which protrudes outside housing 94 and clips over ledge 109 when in the restored position shown in FIG.

4; a second portion 149b which extends inside housing 94 generally parallel to ledge 109; and a third portion 149c which lies at right angle to the second portion 149b and includes a reset hook 149d which is positioned for movement in the plane of the second pointer 148a. Sealing aperture 149e is aligned with the aperture in member 109 when the reset means are restored to permit passage of a seal through such apertures.

The housing sections 92, 94 may comprise individual parts which are assembled in a manufacturing operation, or comprise a single moulded member. The housing 90 may be entirely of transparent material, or the viewing area 107 alone may be of a transparent material. Such variations of the materials and sectioning of the parts for assembly purposes (and other similar variations) are considered to be within the scope of the present invention.

A pair of line terminal blades 138, 141 and a pair of load terminal blades 139, 143 project rearwardly to provide meter socket engaging means positioned for engagement with jaws 22, 24 and jaws 30, 32 respectively of a standard meter socket 10. The outer peripheral rim 103 on the housing 98 is dimensioned to conform to the dimension of the outer rim 17 of a standard meter socket 10 to permit use of a standard sealing rim 63 when the thermal demand meter is used with the meter socket 10.

It is noted that in the embodiment of FIGS. 4–9 no part or portion of the housing 90 projects outside a circumference defined by the forward rim 100 and the rearward rim 103 of the housing 90.

It is also noted that the jaws 110, 112, 114, 116 in the meter receiving section 92 are disposed with the throat receiving portions thereof lying in a vertical plane when the thermal demand meter is assembled with a standard meter socket 10, and that the thin dimensions of blades 138, 141, 143, 139 also lie in a vertical plane when the thermal demand meter is assembled with the meter socket 10. In the embodiment of FIGS. 4–8 with the blades and jaws so positioned, the viewing area 107 will be located on the right hand side of the housing 94 when the thermal demand meter 90 is assembled with the watthour meter 14 and a standard meter socket 10.

Figure 7:
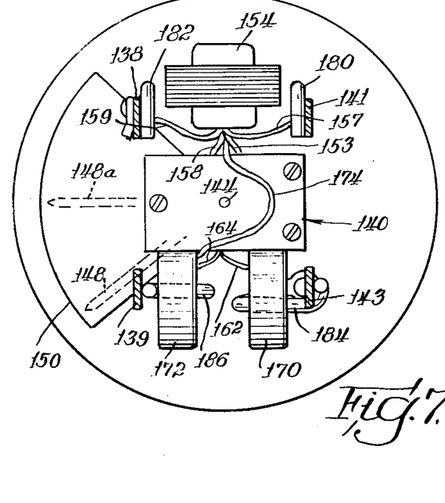
FIG. 7 is a rear plan view of the thermal demand meter shown in FIGS. 4-6 taken along the lines 8—8 in FIG. 6.
Figure 8:
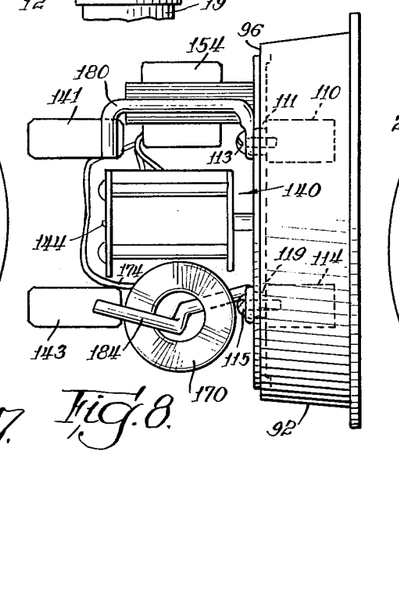
FIG. 8 is a side view of the thermal demand meter shown in FIGS. 4-7.

With reference to FIGS. 7 and 8, one manner of mounting the jaws and blades with the thermal meter elements is shown thereat. As there shown the elements are mounted on the under side of base 96 which forms the inner back wall for housing section 92. It will be apparent however that some or all of the elements may be mounted on the inner side of base member 98 or on the inner side of walls 101, 109, etc., without departing from the spirit or scope of the invention.

Figures 9, 10, 13:
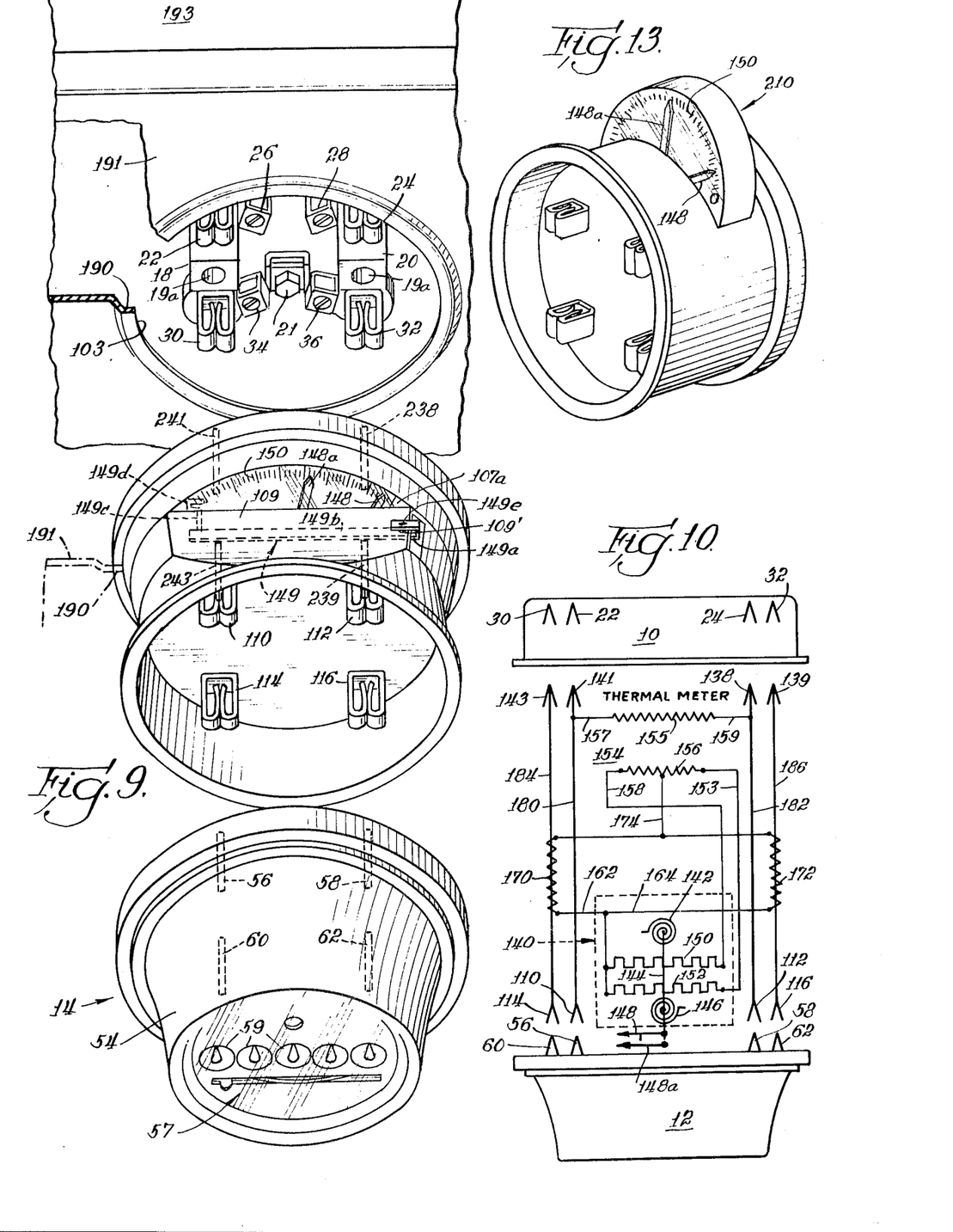
FIG. 9 is an exploded perspective of a further embodiment of the novel thermal demand meter as used with a conventional watthour meter and a ringless type meter socket.
FIG. 10 is a schematic showing of the circuit of the thermal demand meter shown in FIGS. 4-9.
FIG. 13 is a perspective view of an embodiment of the thermal demand meter having an extended viewing area.

The elements of the thermal demand meter may best be understood by reference to the circuit schematic of FIG. 10. As there shown, the thermal meter elements are seen to include a pointer actuating mechanism 140, which may be of the type currently used by any of the meter manufacturers in the commercially available thermal demand meters, and which basically comprises a first spiral bimetallic spring 142 having its inner end connected to pointer shaft 144 and its outer end fixedly secured to suitable anchor means. A second thermal responsive unit including a second spiral bimetallic spring 146 is mounted in like manner in spaced relation with the first bimetallic spring 142 with its inner end connected to the shaft 144 and its outer end fixedly anchored, the second spring being mounted in a differential torque applying mode relative to the spring 142, whereby the rotation of the pointer shaft 144 is dependent upon the difference in torque which is exerted on the pointer shaft 144 by the first and second bimetallic springs 142, 146. A pusher pointer 148 is attached to the outer end of the shaft 144, whereby movement of the shaft 144 and pusher pointer shaft 148 results in movement of the pointer end along a meter scale 150 (FIG. 4) which is calibrated to indicate the measured load in kilowatts, volts, ampere or other quantities. A maximum demand indicator 148a is mounted for free movement in the direction of increasing electric load by the pusher pointer 148, and remains at the point of maximum advance by pusher pointer 148 during any given measuring period. Reset member 149, which is normally sealed by means of a seal which passes through aperture 149e and the aperture in ledge 109 to thereby prevent movement by unauthorized persons, is used by the meter reader to reset the demand indicator 148a each time the meter is read. The indicator mechanism may be of the type shown in U.S. Pat. No. 3,778,711 which issued on Dec. 11, 1973, to Trevor Samuel and is assigned to the assignee of this invention.

Pointer actuator mechanism 140 (FIG. 10) further includes a first heater element 150 for heating the bimetallic spring 142 and a second heater element 152 for heating the bimetallic spring 146. A potential transformer 154 including a primary winding 155 is connected across line extension conductors 180, 182. The secondary winding 156 of transformer 154 has one end thereof connected over conductor 153 to one end of heater 152, and its other end connected over conductor 158 to one end of heater 150. The opposite ends of heaters 150 and 152 are connected over conductors 162 and 164, to the positive end of the windings on toroidal core current transformers 170, 172 respectively. The opposite ends of the windings of current transformers 170, 172 are connected over conductor 174 to the center tap of the secondary winding 156 on the potential transformer 154.

In the embodiment shown herein, line extension conductor 180 (FIG. 10) in the thermal demand meter is connected between line jaw 110 and line blade 141. Line extension conductor 182 is connected between line jaw 112 and line blade 138. The power which appears on line jaws 22, 24 on meter socket 10 is thus extended over blades 141, 138, line extension conductors 180, 182, line jaws 110, 112 and blades 56, 58 on the meter 10.

Load extension conductor 184 (FIG. 8) is connected from load blade 143 through the toroidal core of current transformer 170 to jaw 114, and load extension conductor 186 is connected from blade 139 through the toroidal core of current transformer 172 to load jaw 116, whereby the meter power is extended from the blades 60, 62 in watthour meter 14 over jaws 114, 116 through the cores of transformers 170, 172 to blades 143, 139 and jaws 30, 32 on the meter socket 10.

As best shown in FIGS. 7, 8 and 10, line extension conductor 180 comprises a heavy copper conductor which has one end fastened to jaws 110 (FIG. 8) by the screw means 113 which also extend through metal spacers 111 in base 96 to threaded apertures on jaw 110. Metal spacers 111 are slightly longer than the width of base 96 and provide the electrical connection from the jaws through the base to the conductor which is fastened thereto by screw means 113. The heavy copper conductor 180 extends rearwardly through housing 94 and has its terminating end welded to a portion of blade 141 located within the housing section 94. Line extension conductor 182 is connected in like manner between jaws 112 and blade 138.

Load extension conductor 184 is fastened to jaw 114 by screws 115 which extend through spacers 119 in base 96. Conductor 184 extends generally rearwardly and downwardly from such connection in a first plane which extends transversely of one end of toroidal core 170 to a position adjacent the center of toroidal core 170 at which point conductor 184 is bent approximately 90° to pass through the center of the toroidal current transformer 170, and is thereupon reversely bent to lie in a plane substantially parallel to the first plane at the other end of the toroidal core and extend generally rearwardly upwardly to a position adjacent blade 143 for welding thereto. Load extension conductor 186 which passes through the center of toroidal core of current transformer 172 is connected to the jaw 116 in a like manner and is welded to blade 139 in a like manner. In an alternative embodiment, a single current transformer is used to reduce the space requirements, and the load extension conductors 184, 186 are passed through the same core so that the current vectors are additive.

The manner of mounting of the other elements of the thermal demand meter is shown in FIGS. 7 and 8. As there shown, the pointer actuator mechanism 140 is mounted on spacer members 145 centrally of and in spaced relation with base 96 to thereby provide clearance for accurate movement of the pointer 148a in the space between the forward end of the mechanism 140 and the rear surface of base 96. The ends of pointer members 148, 148a extend radially into the display area 107 and the meter scale 150 is mounted in such area adjacent the path of movement of the end of pointers 148, 148a. The zero mark on the scale 150 is located at the lower end of the scale and the pointers are moved upwardly from such position to indicate the amount of power consumed. In the embodiment the display area 107 is disposed on the right hand side of the member when assembled with a meter socket and viewed from the front side. Potential transformer 154 is fastened to base 96 in an area above and between the blades 138, 141, and current transformers 170, 172 are mounted between blades 139 and 143. The elements are connected by wires 153, etc. in the manner shown in the schematic circuit of FIG. 10.

In use, the primary winding 155 of potential transformer 154 as connected across line extension conductors 180, 182 by conductors 157 and 159 is energized in accordance with the value of the voltage in the line circuit. With the primary winding energized in such manner, the secondary winding 156 energizes the heaters 150, 152 in the pointer actuator mechanism 140 with current $I_e$ which has a value which depends on the value of voltage E. The current transformers 170, 172 via the center tap connection 174 provide current components $I_l$ to the heaters 150, 152. The current components are added in one of the heaters and subtracted in the other of the heaters.

In this manner the heaters are differentially energized by a first current component which corresponds to the voltage supplied to the load, and a second component which corresponds to the current supplied to the load, and the resultant measurement is a function of voltage and current.

The differential in the torque produced on the shaft 144 by the two thermal responsive units 142, 146 is thus a function of the voltage and current, and the pointer shaft 144 rotates counterclockwise a proportionate amount to move pusher pointer 148 along the scale 150 which in turn moves maximum demand indicator pointer 148a therewith, whereby a representation of the demand measured by the thermal demand meter is provided by both pointers. As noted above, as the amount of power consumed decreases, the pointer 148 will rotate in a clockwise direction. Pointer 148a will remain at such position until a load demand of larger amount occurs, or until the reset means are operated by the meter reader to reset the indicator 148a. That is, after the reading has been made, the seal is broken and reset member 149 is moved downwardly. As hook portion 149d engages indicator 148a, continued downward movement urges the indicator 148a toward the zero setting until such time as the indicator 148a is in alignment with pusher pointer 148. The reset member 149 is then returned to its illustrated position and resealed.

While one embodiment of a thermal demand meter is disclosed herein, as noted above, it will be apparent that other known forms of demand meters may be built for use in a similar mode.

Installation of Thermal Demand Meters

In changeover of a standard watthour meter installation to provide thermal demand metering with the novel thermal demand meter of the present invention, it is only necessary for the installer to remove the seal in the clamping ring 63 rotate the clamping screw 72 (FIG. 3) to loosen the sealing ring 63, pull the meter 14 from the meter socket 10 (FIG. 1). Meter 14 is then positioned with blades 56, 58 adjacent jaws 110, 112 of thermal demand meter TDM and blades 60, 62 of meter 14 adjacent jaws 114, 116 and the blades of the watthour meter 14 are then urged into firm engagement with the jaws of thermal demand meter TDM to bring the base rim 53 of the watthour meter 14 into firm engagement with rim 100 of the thermal demand meter TDM. The thermal demand meter TDM (FIG. 4) is next positioned with blades 141, 138 (FIG. 5) adjacent jaws 22, 24 of meter socket 10 and blades 143, 139 adjacent jaws 30, 32, and the blades of thermal demand meter 90 are urged into seated relation with the jaws of the meter socket 10 until base rim 103 is in firm contact with rim 17 of the meter socket 10.

A first sealing ring 63 (FIG. 6) is now passed over the watthour meter 14 to a position adjacent rim 53 (FIG. 6) of the watthour meter 14 and rim 100 of the thermal demand meter TDM, and a second sealing ring 63 is passed over the watthour meter 14 and the thermal demand meter TDM to a position adjacent the outer ring 103 of base 98. Clamp screws 72 on the sealing rings are then tightened and the rings are sealed in the conventional manner. The watthour meter 14 now provides the watthour measurements on dials 59 and the thermal demand meter TDM provides the maximum demand readings on scale 150.

Such changeover from an installation which provides only watthour measurements to an installation which provides combined watthour measurement and thermal demand measurement is obviously fast and efficient, and can be effected with only a very brief interruption of the power to the customer premises. Further, since the same watthour meter is reinstalled at the same location, there is no need to change watthour records for the billing department. Finally, the utility is not faced with the problems of refit, or the problems of inventory buildup of watthour meters.

A further embodiment of the invention is shown in FIG. 9 wherein the display area 107a is disposed at the top of the meter TDM rather than on the right hand side of the meter. In such arrangement, pointers 148, 148a, and scale 150 are rotated approximately ninety degrees counterclockwise from the position shown in FIG. 7 without changing the position of the blades 138, 141, 139, 143. The transformer 154 is moved to the area which has been opened as a result of the shift of the scale 150, and conductors 180, 182 are bent as necessary to avoid the scale 150. The manner in which the display area may be located at other positions around the periphery of the thermal demand meter housing including positions along the left hand side and bottom, and other positions on the right hand side will be apparent therefrom.

Such embodiment of the novel thermal demand meter is shown in FIG. 9 as used with a ringless socket 190. In such use, the cover 191 of the ringless socket is lifted from the box 193 and the watthour meter 14 is removed from the socket. The thermal demand meter 90 is inserted through the rear of the aperture in the cover 191 until the forward side of rim 103 (i.e., the cover engaging member on base 98) engages the back side of cover 191. The blades of watthour meter 14 are then inserted into the jaws 110, 112, 114, 116 of thermal demand meter TDM, and sealing ring 63 is closed and sealed to retain the watthour meter 14 in sealed relation with the thermal demand meter TDM. The two units as thus assembled with the cover 191 are mounted on the box 193 and the blades on the thermal demand meter 90 are moved into engagement with the jaws of the ringless socket. The cover of the ringless socket is then replaced and sealed in the conventional manner.

The embodiment of the thermal demand meter shown in FIGS. 4–8 may also be used with the ringless type meter socket. That is, since the base blades of the thermal demand meter TDM will fit into the same jaws which receive a conventional watthour meter, and since the circumference dimension of socket rim 100 of the thermal demand meter and housing 90 forward of base rim 103 allows it to pass through the aperture in the cover of a ringless meter socket, the novel thermal demand meter shown in FIGS. 4–8 may be used with the ringless socket. Stated more generally, such meter may be used with any existing equipment which is adapted to be used with a standard watthour meter.

Figures 11, 12:
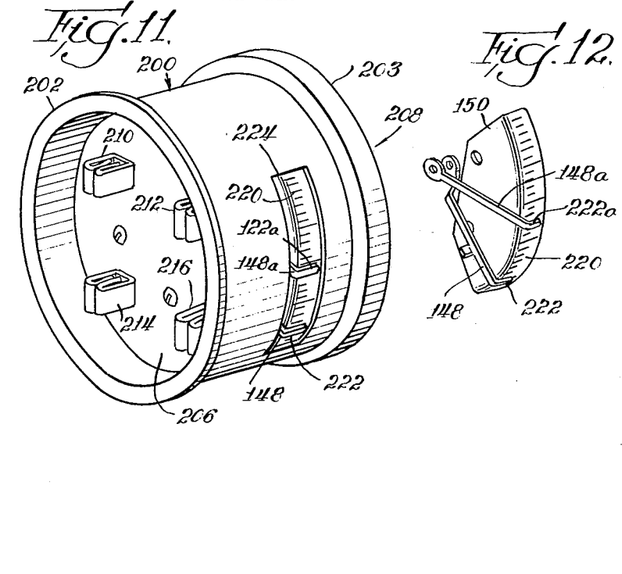
FIGS. 11 and 12 are perspective views of a further embodiment of the thermal demand meter which includes a readout area located along the circumference of the meter housing.

In a further embodiment shown in FIGS. 11 and 12, a cylindrical housing structure 200 is provided which has an outer rim 201 which is of the same dimension as rim 100 on the thermal demand meter TDM (FIG. 4) and a second rim 203 which is the same dimension as rim 103 on the thermal demand meter TDM. An annular recess 206 in the forward portion of cylinder 200 has a bottom wall which locates a set of jaws 210, 212, 214, 216 mounted in the manner of the jaws used in the thermal demand meter TDM of FIGS. 4–6. The thermal meter elements may be mounted on the rear surface of base 206 in the manner shown in FIGS. 8 and 9 to provide a thermal demand meter having rearward extending blades for engagement with the jaws 22, 24, 30, 32 in the meter socket 10.

The thermal demand assembly mounted on base 206 differs from that shown in FIGS. 4–8 only in its inclusion of a scale segment 220 (FIG. 12) to the outer peripheral edge of scale member 150 which segment is disposed at ninety degrees to scale member 150. The scale markings are inscribed on the face of such segment and the ends of pointer 148, 148a have an end segment 222, 222a which extend approximately 90° to the pointer length to cooperate with the scale segment 220.

A transparent viewing area 224 is provided in the cylinder 200 adjacent the scale segment 220 to permit readout of the thermal demand measurements. The manner in which the edge reading scale 220 may be used at other locations and with other housing designs will be apparent from such disclosure.

Yet a further embodiment of the invention is shown in FIG. 13 in which the housing similar to that shown in FIG. 4 includes a projecting portion 210 for housing the scale 150 and pointers 148 and 148a. In such modification, the pointer actuating assembly 140 may be moved upwardly from the position shown in FIG. 7 and the current transformer (or transformers) may be moved to the area previously occupied by the pointer actuator assembly 140. In such embodiment both the watthour and demand meter readings are in the direct line of sight of the meter reader. Such housing configuration also provides additional space for mounting of the elements of the thermal demand meter, and thereby permits more flexibility in design layout. Such housing configuration however requires more room to install than the housing of FIGS. 4–6, and cannot be readily used with the standard ringless type socket shown in FIG. 9.

We claim:

1. In an electrical meter for use with a standard watthour meter and a standard meter socket, a housing including a display area, a meter receiving section comprising a base plate, a plurality of jaw members supported by said base plate and positioned on said base plate to receive the blades of a standard watthour meter, meter socket engaging means comprising a plurality of blades extending rearwardly of said housing and positioned to engage the jaws of a standard meter socket, an electrical meter assembly supported within a longitudinally disposed part of said housing and in tandem relation with said watthour meter and said meter socket, said electrical meter assembly including an indicator located adjacent said display area, a plurality of conductor means connecting said blade members to said jaw members, and means for coupling said electrical meter assembly to at least one of said conductor means to provide a power measurement on said indicator, said housing including the elctrical meter assembly being located within a circumference defined by the rearward projection of the circumference of the base of said standard watthour meter.

2. In an electrical meter for use with a standard watthour meter and a ringless socket box having a cover with an aperture, a housing including a base member having a cover engaging member which is larger than said aperture to prevent passage of said cover engaging member through said aperture, the portions on said housing which are forward of said cover engaging member being of a configuration which permits the passage thereof through said aperture, whereby with insertion of said housing through said aperture from the rear of the cover said cover engaging member is brought into contact with the rear surface of said cover to position said housing relative to said cover, a plurality of jaw members supported by said base member and positioned on said base member to receive the blades of a standard watthour meter, meter socket engaging means comprising a plurality of blades extending rearwardly of said base member on said housing and positioned to engage the jaws of a standard meter socket whenever said cover is moved to the closed position for said ringless socket box, an electrical meter assembly supported within said housing including a display area and an indicator located adjacent said display area, a plurality of conductor means connecting said blade members to said jaw members, and means for coupling said electrical meter assembly to at least one of said conductor means to provide a measurement of the demand on said indicator.

3. An electrical meter as set forth in claim 1 in which said meter has a circumferential rim for mounting purposes, and said meter engaging section on said housing includes a peripheral ring the forward end of which has a circumference which is similar to the circumference of the rim on said meter, and which includes a standard meter sealing ring having downwardly depending sides for engaging the side surfaces of the meter rim and said peripheral rim on said housing when the meter is assembled with said housing.

4. An electrical meter as set forth in claim 1 in which said meter socket engaging section of said housing includes an outer peripheral rim on one end thereof which is dimensioned to permit sealing of said housing to said meter socket with a standard meter sealing ring when said housing is assembled with a meter socket.

5. An electrical meter as set forth in claim 1 in which said meter display area is located on a side of said longitudinally disposed housing when said housing is assembled with a standard meter socket, and in which the portion of the housing forward of said display area is indented to permit viewing of said meter display area which lies within the circumference defined by the rearward projection of the watthour meter base.

6. An electrical meter as set forth in claim 1 in which said electrical meter assembly includes at least one current transformer located within said longitudinally disposed part of said housing and in which a first pair of said conductor means are connected to a first pair of said jaw members in said meter engaging section and pass through said housing for connection to a first set of line blades in the meter socket engaging means, and a second pair of said conductor means are connected to a second pair of said blades in said meter socket engaging means and pass through said housing and said current transformer to the second pair of jaws in said meter engaging section, said conductor means being displaced from a rearwardly projecting longitudinal path to provide approximately a 90° deflection of said indicator across said display area.

7. An electrical meter as set forth in claim 1 in which said electrical meter assembly includes at least one current transformer located in the longitudinally disposed part of said housing, and in which at least one of said conductor means is connected to one of said jaw members and one of said blade members, and passes through the core of said current transformer.

8. An electrical meter as set forth in claim 2 in which at least one pair of said blades is positioned to engage the line jaws of the meter socket, and in which said electrical meter assembly comprises a thermal demand meter assembly which includes a potential transformer and at least one current transformer located in the longitudinally disposed part of said housing, and means connecting said potential transformer across the power which is provided over said one pair of blades, and in which said conductor means passes through said current transformer.

9. A thermal demand meter for use with a standard watthour meter having watthour indicator means and a standard meter socket in the measurement of power supplied to a load, a housing longitudinally mounted between said watthour meter and said meter socket including a meter receiving section having a recessed base plate member, jaw means supported by said base plate member including a first pair of jaws positioned to receive the line blades of said watthour meter and a second pair of jaws positioned to receive the load blades of said watthour meter, a peripheral rim on the outer end of said meter receiving section of said housing having a circumference which conforms to the circumference of the rim on the meter base to permit sealing of said housing rim and said meter rim with a standard sealing ring, a base member for closing a second end on said housing, a thermal demand meter assembly supported within said housing between said base plate member and said base member including demand indicator means, a display area on said housing located adjacent said demand indicator means, the housing portion located forwardly of said display area having an indented portion to permit readout of the measurements provided by said thermal demand meter assembly, a plurality of blade members extending rearwardly of said second base member and positioned to engage the jaws of said standard meter socket, a plurality of connector means, each of which connects one of said blade members to a corresponding one of said jaw members, and means coupling said thermal demand meter assembly to said connector means, whereby watthour measurements of the energy supplied to the load are provided on said watthour indicator means and demand measurements are provided by said demand indicator means.

10. An electrical meter as set forth in claim 1 in which said meter socket has a circular outer circumference, and said electrical meter assembly is located within a circumference defined by the forward projection of the circular circumference of said meter socket.

11. An electrical meter as set forth in claim 2 in which said cover engaging member comprises a cylindrical member which engages the inner surface of said cover about its outer periphery to provide a weather seal with the cover of said ringless socket box.

12. In an electrical meter for use with a ringless socket box having a cover with an aperture and a standard watthour meter having a first display area and a first base member, said electrical meter having a housing including a second base member having a cover engaging member which is larger than said aperture to prevent passage of said cover engaging member through said aperture, the portions on said housing which are forward of said cover engaging member being of a configuration which permits the passage thereof through said aperture, whereby with insertion of said housing through said aperture from the rear of the cover said cover engaging member is brought into contact with the rear surface of said cover to position said housing relative to said cover, a plurality of jaw members supported by said second base member and positioned on said second base member to receive the blades of a standard watthour meter, meter socket engaging means comprising a plurality of blades extending rearwardly of said second base member on said housing and positioned to engage the jaws of said standard meter socket whenever said cover is moved to the closed position for said ringless socket box, a second display area for said housing, an electrical meter assembly supported within said housing including an indicator located adjacent said second display area, said second display area being located within a circumference defined by the rearward projection of the circumference of the base member of said watthour meter and in a plane parallel to the plane of the watthour meter display area, a plurality of conductor means connecting said blade members to said jaw members, and means for coupling said electrical meter assembly to at least one of said conductor means to provide a further measurement by said indicator and said second display area, whereby a first and a second set of metered information is provided on separate displays located within a circumference which is defined by the base of a standard watthour meter.

* * * * *